(12) United States Patent
Lee et al.

(10) Patent No.: US 10,634,972 B2
(45) Date of Patent: *Apr. 28, 2020

(54) CONFIGURABLE HEATING DEVICE AND METHOD OF USING THE SAME

(71) Applicant: TAIWAN SEMICONDUCTOR MANUFACTURING COMPANY LTD., Hsinchu (TW)

(72) Inventors: Hui-Yu Lee, Hsinchu (TW); Jui-Feng Kuan, Hsinchu County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/222,824

(22) Filed: Dec. 17, 2018

(65) Prior Publication Data

US 2019/0129272 A1 May 2, 2019

Related U.S. Application Data

(63) Continuation of application No. 15/663,489, filed on Jul. 28, 2017, now Pat. No. 10,162,244.

(60) Provisional application No. 62/525,561, filed on Jun. 27, 2017.

(51) Int. Cl.
| | |
|---|---|
| *G02F 1/225* | (2006.01) |
| *H03M 1/06* | (2006.01) |
| *H03M 1/12* | (2006.01) |
| *G02F 1/01* | (2006.01) |

(Continued)

(52) U.S. Cl.
CPC .............. *G02F 1/225* (2013.01); *G02F 1/009* (2013.01); *G02F 1/01* (2013.01); *G02F 1/0147* (2013.01); *G02F 1/3132* (2013.01); *H03M 1/06* (2013.01); *H03M 1/12* (2013.01); *G02F 2203/15* (2013.01)

(58) Field of Classification Search
USPC .................................................. 359/288, 289
See application file for complete search history.

(56) References Cited

U.S. PATENT DOCUMENTS

| | | |
|---|---|---|
| 4,790,654 A | 12/1988 | Clarke et al. |
| 5,029,311 A | 7/1991 | Brandkamp et al. |
| 5,796,076 A | 8/1998 | Azuma |

(Continued)

OTHER PUBLICATIONS

Masood et al., Comparison of Heater Architectures for Thermal Control of Silicon Photonic Circuits, 10th International Conference on Group IV Photonics, IEEE Oct. 24, 2013 (Year: 2013).

(Continued)

*Primary Examiner* — Howard Williams
(74) *Attorney, Agent, or Firm* — Hauptman Ham, LLP

(57) ABSTRACT

A device includes a comparator configured to compare a transmission phase of light in a photonic component with a reference phase. The device further includes a heater configured to control a temperature of the photonic component. The heater includes a plurality of heater segments, and a plurality of switches, wherein each switch of the plurality of switches is between a pair of heater segments of the plurality of heater segments. The device further includes a controller configured to control operation of each switch of the plurality of switches based on results from the comparator for selectively connecting heater segments of the plurality of heater segments in series.

20 Claims, 7 Drawing Sheets

(51) Int. Cl.
*G02F 1/00* (2006.01)
*G02F 1/313* (2006.01)

(56) References Cited

U.S. PATENT DOCUMENTS

| | | | | |
|---|---|---|---|---|
| 6,128,422 | A * | 10/2000 | Hodgson | G02F 1/3517 |
| | | | | 385/11 |
| 6,351,578 | B1 | 2/2002 | Brinkman et al. | |
| 7,054,340 | B1 * | 5/2006 | Hillmer | H01S 5/0612 |
| | | | | 359/330 |
| 7,817,923 | B2 | 10/2010 | Akiyama et al. | |
| 2002/0181869 | A1 | 12/2002 | Lin | |
| 2004/0042722 | A1 | 3/2004 | Sandhu et al. | |
| 2010/0226658 | A1 | 9/2010 | Fujimoto et al. | |
| 2010/0260453 | A1 * | 10/2010 | Block | G02B 6/12007 |
| | | | | 385/24 |
| 2013/0156364 | A1 * | 6/2013 | Chen | G02B 6/12004 |
| | | | | 385/14 |
| 2014/0161387 | A1 | 6/2014 | Ide | |
| 2016/0223844 | A1 | 8/2016 | Ichikawa | |
| 2016/0349297 | A1 | 12/2016 | van der Cammen | |
| 2018/0146511 | A1 * | 5/2018 | Stevenson | G01K 7/16 |

OTHER PUBLICATIONS

F Flamini et al., Reconfigurable Quantum Photonic Circuits, Light: Science & Applications, doi: 10.1038/Isa.2015.127, Nov. 2015, 2015 CIOMP www. nature/com/Isa (Year: 2015).

Campenhout et al., Integrated NiSi Waveguide Heaters for CMOS-Compatible Silicon Thermo-Optic Devices, Optical Society of America, Optics Letters, vol. 35, No. 7, Apr. 1, 2010 (Year: 2010).

* cited by examiner

_US 10,634,972 B2_

CONFIGURABLE HEATING DEVICE AND METHOD OF USING THE SAME

PRIORITY CLAIM

This application is a continuation of U.S. application Ser. No. 15/663,489, filed Jan. 28, 2017, which claims the benefit of U.S. Provisional Application No. 62/525,561, filed Jun. 27, 2017, which are herein incorporated by reference in their entireties.

BACKGROUND

Photonic-electronic co-design system is realized by integrating photonic integrated (PI) circuits to silicon substrates. The efficiency of the signal transmission in photonic components is highly related to the wavelength of the light transmitted therein since the reflection power of the light is dependent thereon. However, the wavelength is affected by the ambient temperature that the photonic components locate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
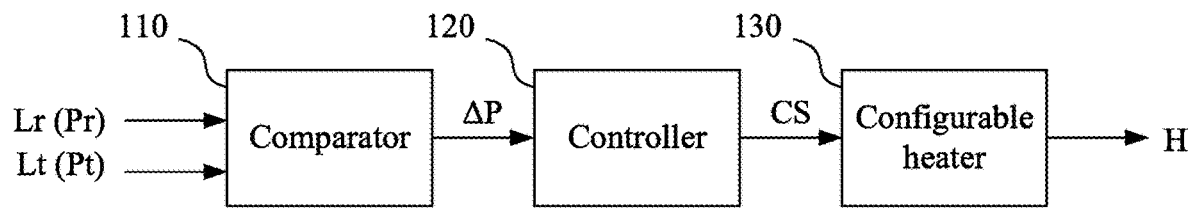
FIG. 1 is an exemplary diagram of a configurable heating device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

FIG. 1 is an exemplary diagram of a configurable heating device 100 in accordance with various embodiments of the present disclosure.

In some embodiments, the configurable heating device 100 is used in a photonic-electronic co-design ecosystem (not illustrated). The photonic-electronic co-design ecosystem integrates photonic components and electronic components (not illustrated), in which at least one of the photonic components is configured to transmit signals in the form of a light Lt having a transmission phase Pt. In some embodiments, the photonic components are waveguides.

In some embodiments, the configurable heating device 100 is a part of the electronic components and is configured to perform feedback control of light transmission in the photonic components of the photonic-electronic co-design ecosystem.

For illustration in FIG. 1, the configurable heating device 100 includes a comparator 110, a controller 120 and a configurable heater 130.

The comparator 110 is configured to compare the transmission phase Pt of the light Lt transmitted in the photonic component with a reference phase Pr of a reference light Lr to generate a phase difference ΔP.

In some embodiments, the phase difference ΔP is expressed by the following equation: ΔP=Pt−Pr. In some embodiments, the phase difference ΔP is generated by the comparator 110 in the form of an electrical current.

The controller 120 is configured to generate a combination or a group of control signals CS based on the phase difference ΔP to control the configurable heater 130. For illustration, each phase difference ΔP correspond to multiple control signals CS, and the control signals CS are configured for controlling the configurable heater 130 to have a corresponding configuration. The amount of heat H generated by the configurable heater 130 depends on the configuration of the configurable heater 130. Accordingly, different configurations of the configurable heater 130 result in different amounts of heat H. In some embodiments, the controller 120 generates the combination of control signals CS by using a look-up table (not shown).

The configuration of the configurable heating device 100 illustrated in FIG. 1 is given for illustrative purposes. Various configurations of the configurable heating device 100 are within the contemplated scope of the present disclosure.

Figure 2A:
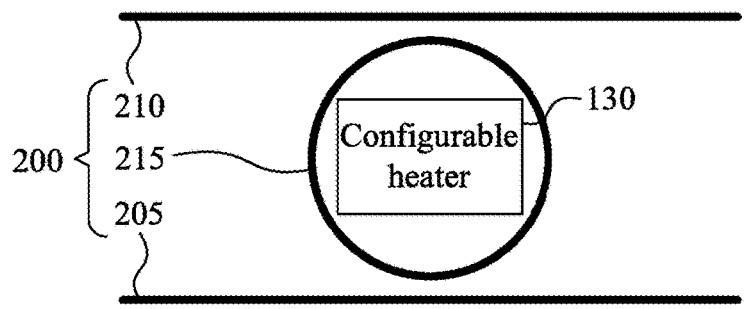
FIG. 2A is a diagram of a top view of the configurable heater illustrated in FIG. 1, and a photonic component, in accordance with various embodiments of the present disclosure.

FIG. 2A is a diagram of a top view of the configurable heater 130 illustrated in FIG. 1, and a photonic component 200, in accordance with various embodiments of the present disclosure.

In some embodiments, the configurable heater 130 is disposed neighboring to the photonic component 200. The photonic component 200 is a ring coupler, which, in some embodiments, is implemented by a photonic coupler having two transmission lines 205 and 210 and a ring-shaped transmission line 215 that is disposed between the transmission lines 205 and 210, as illustrated in FIG. 2A. In some embodiments, the configurable heater 130 is disposed inside the ring-shaped transmission line 215. For illustration, one of the transmission lines 205 and 210 couples energy to the other one of the transmission lines 205 and 210 through the ring-shaped transmission line 215.

Figure 2B:
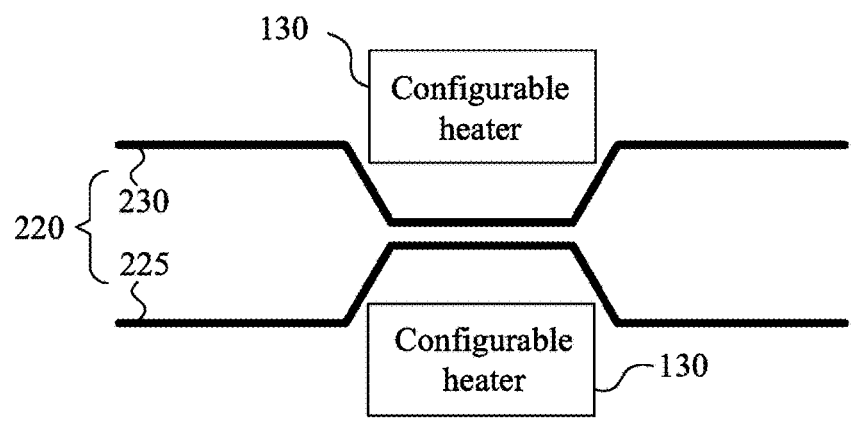
FIG. 2B is a diagram of a top view of two configurable heaters illustrated in FIG. 1, and a photonic component, in accordance with various embodiments of the present disclosure.

FIG. 2B is a diagram of a top view of two configurable heaters 130 illustrated in FIG. 1, and a photonic component 220, in accordance with various embodiments of the present disclosure.

In some embodiments, the configurable heaters 130 are disposed neighboring to the photonic component 220. The photonic component 220 is a cross coupler, which, in some embodiments, is implemented by a photonic coupler having two transmission lines 225 and 230, as illustrated in FIG. 2B. In some embodiments, two configurable heaters 130 are disposed at one side of the transmission line 225 and one side of the transmission line 230, respectively. For illustration, one of the transmission lines 225 and 230 couples energy to the other one of the transmission lines 225 and 230.

As illustratively shown in FIG. 2A and FIG. 2B, each of the configurable heaters 130 provides heat to the environment that the photonic component 200 or the photonic component 220 locates. The ambient temperature of the environment increases when more heat is generated by the configurable heaters 130. On the contrary, the ambient temperature of the environment decreases when less heat is generated by the configurable heaters 130.

In some embodiments, the wavelength of the light Lt transmitted in the photonic component increases when the ambient temperature increases. Moreover, the reflection power in the photonic component is highly dependent on the wavelength of the light Lt transmitted in the photonic component. In some embodiments, a peak of the reflection power corresponds to a specific value of the wavelength.

In some embodiments, the phase difference ΔP reflects a difference between the wavelength of the light Lt transmitted in the photonic component and a target wavelength corresponding to the peak of the reflection power. As a result, based on the phase difference ΔP, the configurable heater 130 is controlled to provide different amount of heat to the environment that the photonic component locates in order to modify the wavelength of the light Lt to meet the target wavelength.

More specifically, under a condition that the phase difference ΔP indicates that the wavelength of the light Lt transmitted in the photonic component is smaller than the target wavelength, when the phase difference ΔP increases, the controller 120 generates a combination of the control signals CS according to the phase difference ΔP, and such a combination of the control signals CS controls the configurable heater 130 to provide relatively more amount of heat to the photonic component, in order to rapidly increase the ambient temperature.

On the other hand, under the condition that the phase difference ΔP indicates that the wavelength of the light Lt transmitted in the photonic component is larger than the target wavelength, when the phase different ΔP increases, the controller 120 generates a combination of the control signals CS according to the phase difference ΔP, and such a combination of the control signals CS adjusts the configuration of the configurable heater 130 to provide less amount of heat to the photonic component to rapidly decrease the ambient temperature.

The number and the position of the configurable heater 130 relative to the photonic component in FIG. 2A and FIG. 2B are given for illustrative purposes. Various numbers and the positions of the configurable heater 130 are within the contemplated scope of the present disclosure.

The configuration and the configuring mechanism of the configurable heater 130 is described in detail in the following paragraphs in accompanied with FIG. 3A and FIG. 3B.

Figure 3A:
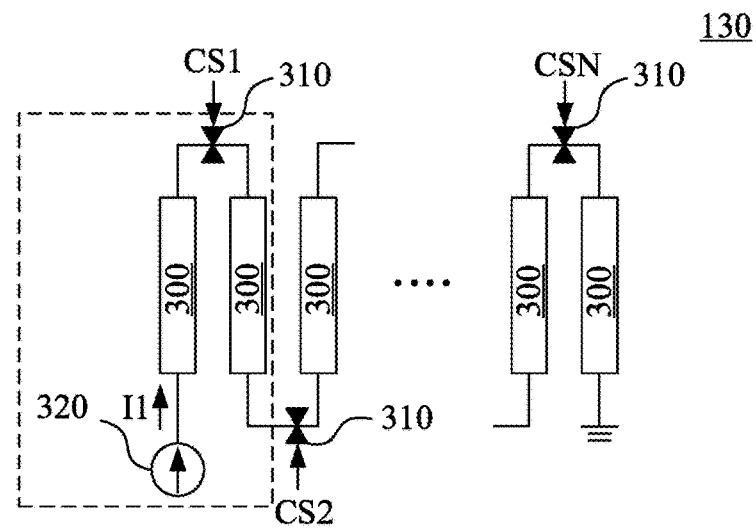
FIG. 3A is an exemplary diagram of the configurable heater illustrated in FIG. 1, in accordance with various embodiments of the present disclosure.

FIG. 3A is an exemplary diagram of the configurable heater 130 illustrated in FIG. 1, in accordance with various embodiments of the present disclosure.

The configurable heater 130 includes a plurality of heater segments 300. As illustratively shown in FIG. 3A, the heater segments 300 are strips disposed parallel to each other. In some embodiments, the first one of the heater segments 300 is electrically coupled to a current source 320. In some embodiments, the material of the heater segments 300 includes metal, and each one of the heater segments 300 operates to generate heat when a current I1 from the current source 320 flows through each corresponding heater segment 300, as illustrated in FIG. 3A.

The configurable heater 130 further includes a plurality of switches 310. Each one of the switches 310 is disposed between a pair of the heater segments 300. In some embodiments, the control signals CS illustrated in FIG. 1 include control signals CS1, CS2, . . . , and CSN as illustrated in FIG. 3A. Each one of the control signals CS1, CS2 . . . , and CSN is configured to control a corresponding switch 310 of the switches 310, in order to allow the current I1 from the current source 320 flow through the corresponding heater segment 300, such that the corresponding heater segment 300 is conducted accordingly.

Figure 3B:
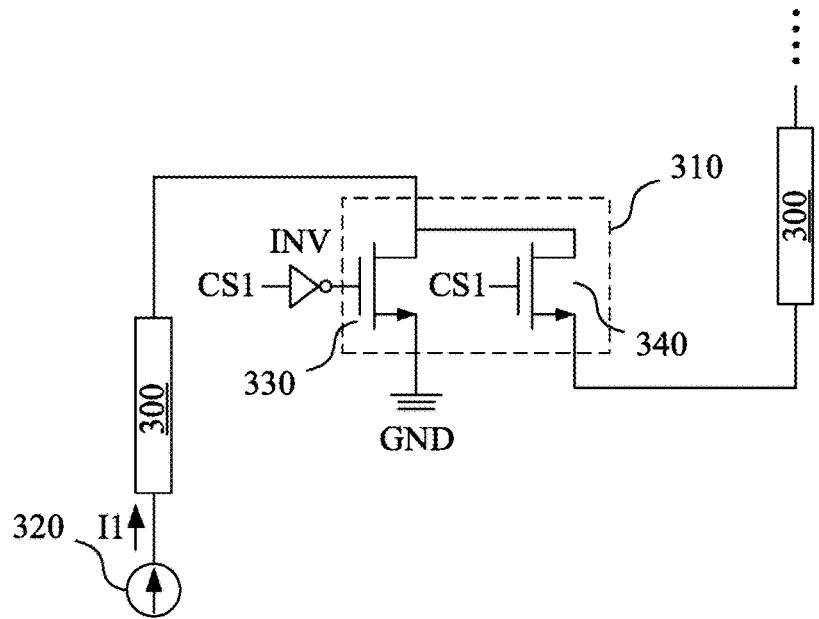
FIG. 3B is an exemplary diagram illustrating a part of the configurable heater in the dashed line frame in FIG. 3A in accordance with various embodiments of the present disclosure.

FIG. 3B is an exemplary diagram illustrating a part of the configurable heater 130, in the dashed line frame in FIG. 3A, in accordance with various embodiments of the present disclosure.

As illustratively shown in FIG. 3B, the first and the second heater segments 300, the switch 310 disposed therebetween, and the current source 320 in FIG. 3A are exemplarily illustrated. The switch 310 includes a first transistor 330 and a second transistor 340. In some embodiments, each of the first transistor 330 and the second transistor 340 is an N-type metal oxide semiconductor (NMOS) transistor.

In some embodiments, the gates of the first transistor 330 and the second transistor 340 are controlled by the same control signal CS1 generated by the controller 120. For illustration, the gate of the first transistor 330 receives the control signal CS1 through an inverter INV, and the gate of the second transistor 340 receives the control signal CS1 directly. For illustration of operation, when the control signal CS1 that controls the first transistor 330 and the second transistor 340 is logic 0, the first transistor 330 is turned on and the second transistor 340 is turned off.

Under such a condition, the switch 310 electrically couples the first heater segment 300 to a ground terminal GND due to the turn-on of the first transistor 330. The current I1 generated by the current source 320 only flows through the first heater segments 300. As a result, only the first heater segment 300 is in operation to generate the heat.

On the other hand, when the corresponding control signal CS1 that controls the first transistor 330 and the second transistor 340 is logic 1, the first transistor 330 is turned off and the second transistor 340 is turned on.

Under such a condition, the switch 310 electrically couples the first heater segment 300 to the second heater segment 300 due to the turn-on of the second transistor 340. The current I1 generated by the current source 320 flows through both of the first and the second heater segments 300. As a result, both of the first and the second heater segments 300 are in operation to generate the heat.

The configuration of the switch 310 in FIG. 3B is given for illustrative purposes. Various configurations of the switch 310 in FIG. 3B are within the contemplated scope of the present disclosure. For example, in various embodiments, each one of the first transistor 330 and the second transistor 340 is implemented by a PMOS transistor, or is implemented by a transmission gate composed of one NMOS transistor and one PMOS transistor.

Based on the above with reference to FIG. 3A and FIG. 3B, the first heater segment 300 is controlled to be conducted by controlling the corresponding switch 310 with, for illustration, the control signal CS1. Correspondingly, the heater segments 300 other than the first heater segment 300 are controlled to be conducted by controlling the corresponding switches 310 with, for illustration, the respective control signals CS2-CSN as illustrated in FIG. 3A.

For illustrations above, the number of the heater segments 300 in operation is trimmable based on the combination of the control signals CS. As discussed above, the combination of the control signals CS is generated by the controller 120 based on the phase difference $\Delta P$. Accordingly, the number of the heater segments 300 in operation is trimmable based on the phase difference $\Delta P$.

The generation of the combination of the control signals CS based on the phase difference $\Delta P$ is described in detail in the following paragraphs accompanied with Table 1.

In some embodiments, the value of the phase difference $\Delta P$ is categorized into one of a plurality of ranges, in which each of the ranges corresponds to one digital code, and the digital code corresponds to one combination of the control signals CS.

Table 1 is an exemplary look-up table illustrating the corresponding relation between the digital codes and the combinations of the control signals CS in accordance with various embodiments of the present disclosure.

As illustratively shown in Table 1, three bits of the digital codes that corresponds to a combination of the control signals that includes seven control signals CS1-CS7 are exemplarily illustrated. The seven control signals CS1-CS7 control seven switches 310 labeled as Switch1 to Switch7 that correspond to eight heater segments 300.

TABLE 1

| Digital codes | Switch1 (CS1) | Switch2 (CS2) | Switch3 (CS3) | Switch4 (CS4) | Switch5 (CS5) | Switch6 (CS6) | Switch7 (CS7) |
|---|---|---|---|---|---|---|---|
| 000 | 0 | 0 | 0 | 0 | 0 | 0 | 0 |
| 001 | 0 | 0 | 0 | 0 | 0 | 0 | 1 |
| 010 | 0 | 0 | 0 | 0 | 0 | 1 | 1 |
| 011 | 0 | 0 | 0 | 0 | 1 | 1 | 1 |
| 100 | 0 | 0 | 0 | 1 | 1 | 1 | 1 |
| 101 | 0 | 0 | 1 | 1 | 1 | 1 | 1 |
| 110 | 0 | 1 | 1 | 1 | 1 | 1 | 1 |
| 111 | 1 | 1 | 1 | 1 | 1 | 1 | 1 |

In some embodiments, Switch1 to Switch7 are arranged in the form illustrated in FIG. 3B and each of Switch1 to Switch7 includes NMOS transistors, PMOS transistors, or transmission gates, as discussed above.

In some embodiments, the digital codes as discussed above correspond to various ranges of values of the phase difference $\Delta P$. For illustration, 8 digital codes illustratively shown in Table 1 correspond to a first range, a second range, . . . , and an eighth range of values of the phase difference $\Delta P$, respectively.

For illustration, when the value of the phase difference $\Delta P$ is within the first range that corresponds to the digital code "000," the controller 120 generates the control signals CS1-CS7 all having logic 0, as shown in Table 1, such that Switch1 to Switch7 are all turned off. As a result, only the first heater segment 300 coupled to the current source 320 is in operation.

On the other hand, when the value of the phase difference $\Delta P$ is within the eighth range that corresponds to the digital code "111", the controller 120 generates the control signals CS1-CS7 all having logic 1, as shown in Table 1, such that Switch1 to Switch7 are all turned on. As a result, eight heater segments 300 are all in operation.

Based on the above, the controller 120 generates various combinations of the control signals CS by using the look-up table based on the phase difference ΔP, in order to trim the number of the heater segments 300 in operation.

The configuration of the configurable heater 130 in FIG. 3A and the configuration of the switch 310 in FIG. 3B are given for illustrative purposes. Various configurations of the configurable heater 130 in FIG. 3A and various configurations of the switch 310 in FIG. 3B are within the contemplated scope of the present disclosure.

In some embodiments, the phase difference ΔP indicates that the wavelength of the light Lt transmitted in the photonic component is smaller than the target wavelength, in which the target wavelength corresponds to a highest transmission efficiency. Under such a condition, the ambient temperature is able to be increased to modify the wavelength of the light Lt, in order to meet the target wavelength.

For illustration, when the value of the phase difference ΔP increases, the ambient temperature increases accordingly to modify the wavelength, as discussed above. Accordingly, more of the heater segments 300 needs to be conducted and are thus coupled in series through the switches 310 to the current source 320, in order to provide more heat.

In some other embodiments, the phase difference ΔP indicates that the wavelength of the light Lt transmitted in the photonic component is larger than the target wavelength. Under such a condition, the ambient temperature is able to be decreased to modify the wavelength of the light Lt, in order to meet the target wavelength.

For illustration, when the value of the phase difference ΔP increases, the ambient temperature needs to decrease accordingly to modify the wavelength, as discussed above. Accordingly, less of the heater segments 300 needs to be conducted, in order to provide less heat.

Figure 4:
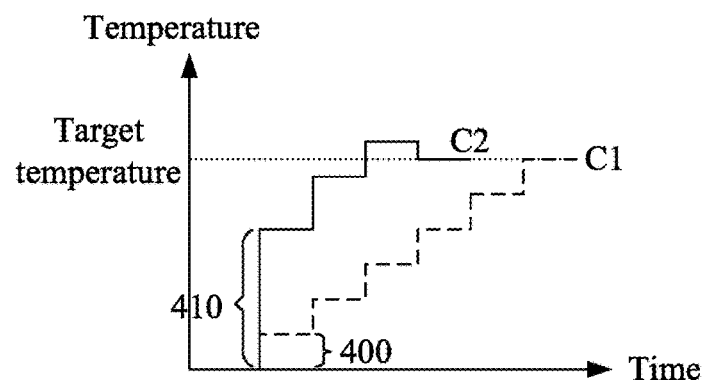
FIG. 4 is an exemplary diagram illustrating a relation between the time and the ambient temperature affected by a heater in accordance with various embodiments of the present disclosure.

FIG. 4 is an exemplary diagram illustrating a relation between the time and the ambient temperature affected by a heater in accordance with various embodiments of the present disclosure.

In some approaches, the heater generates a fixed amount of heat to increase a fixed temperature at each step. Under such a condition, the ambient temperature is increased in a step-wise manner illustrated as the curve C1 in FIG. 4, in which the amount of an increase 400 in temperature at each step is fixed, as illustrated in FIG. 4. When a difference between a present ambient temperature and a target ambient temperature increases, a time duration required for the heater to generate heat to increase the ambient temperature becomes relatively longer accordingly. With the longer time duration to increase the ambient temperature, a longer time duration is required to modify the wavelength of the light Lt to meet the target wavelength, as discussed above.

Compared to the approaches that increase a fixed temperature at each step, as discussed above, by employing the configurable heater 130 as illustrated in the embodiments discussed above, the number of the heater segments 300 in operation is trimmable based on the phase difference ΔP. When the phase difference ΔP reflects that the difference between the present ambient temperature and the target ambient temperature increases, more of the heater segments 300 are controlled to be in operation. Accordingly, the amount of heat is increased rapidly due to more of the heater segments 300 in operation. For illustration of the curve C2 in FIG. 4, an increase 410 in temperature at one step is relatively larger than the increases in temperature at other steps. With the increase 410 in temperature, the present ambient temperature is increased rapidly to meet the target ambient temperature. Accordingly, the wavelength of the light Lt is able to be rapidly modified to meet the target wavelength. As a result, the transmission of the light Lt having the target wavelength in the photonic component is more efficient.

Figure 5A:
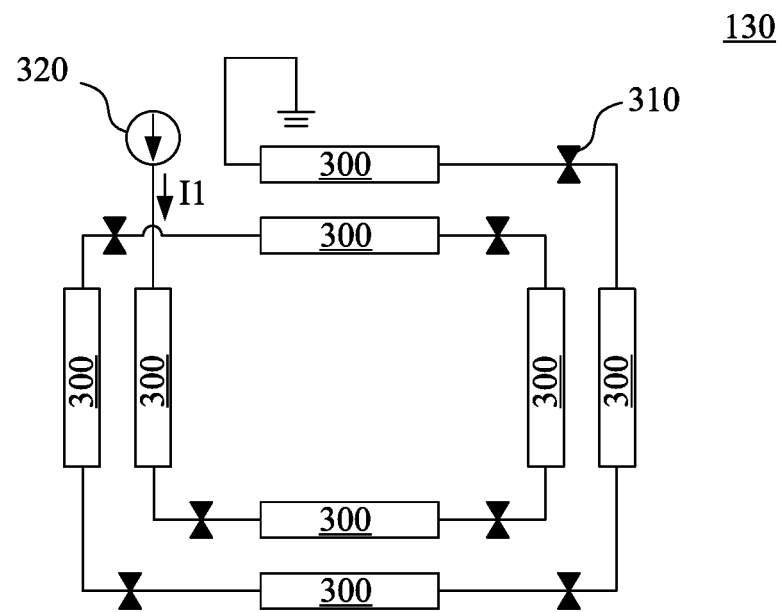
FIG. 5A is an exemplary diagram illustrating another implementation of the configurable heater illustrated in FIG. 1, in accordance with various embodiments of the present disclosure.

FIG. 5A is an exemplary diagram illustrating another implementation of the configurable heater 130 illustrated in FIG. 1, in accordance with various embodiments of the present disclosure.

As illustratively shown in FIG. 5A, eight heater segments 300 are arranged as a spiral shape, in which four of the heater segments 300 form an outer circle and the other four of the heater segments 300 form an inner circle surrounded by the outer circle.

Figure 5B:
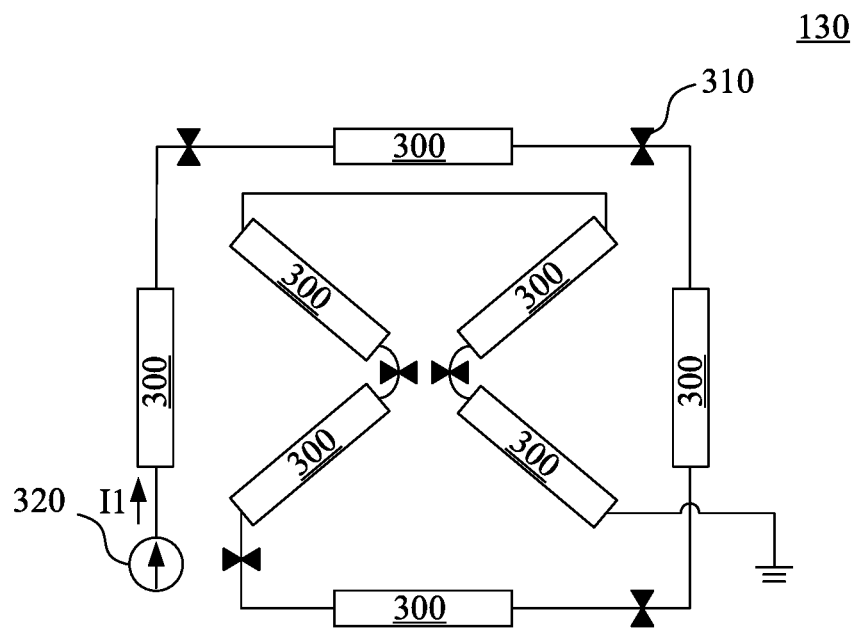
FIG. 5B is an exemplary diagram illustrating yet another implementation of the configurable heater illustrated in FIG. 1, in accordance with various embodiments of the present disclosure.

FIG. 5B is an exemplary diagram illustrating yet another implementation of the configurable heater 130 illustrated in FIG. 1, in accordance with various embodiments of the present disclosure.

As illustratively shown in FIG. 5B, eight heater segments 300 are arranged as a cross shape surrounded by a circle shape, in which four of the heater segments 300 form the circle shape and the other four of the heater segments 300 form the cross shape surrounded by the circle shape.

In some embodiments, the switch 310 illustrated in FIG. 3B, FIG. 5A or FIG. 5B includes P-type metal oxide semiconductor transistors or transmission gates. Under such a condition, the corresponding relation between the digital codes and the combinations of the control signals CS is different based on the components used in the switch 310.

The configurations of the configurable heater 130 illustrated in FIG. 5A and FIG. 5B are given for illustrative purposes. Various configurations of the configurable heater 130 illustrated in FIG. 5A and FIG. 5B are within the contemplated scope of the present disclosure.

Figure 6A:
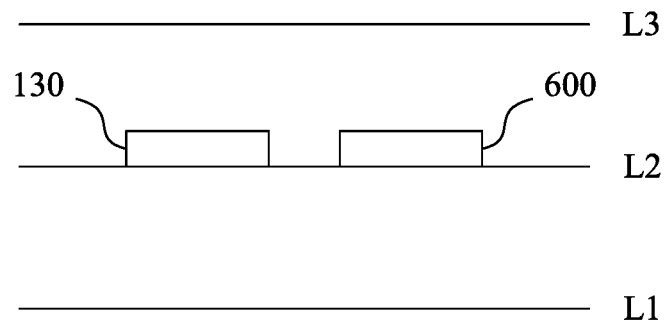
FIGS. 6A-6C are exemplary cross-sectional diagrams illustrating the position of the configurable heater illustrated in FIG. 1, relative to a photonic component, in accordance with various embodiments of the present disclosure.

FIG. 6A is an exemplary cross-sectional diagram illustrating the position of the configurable heater 130 illustrated in FIG. 1, relative to a photonic component 600, in accordance with various embodiments of the present disclosure.

In some embodiments, the configurable heater 130 and the photonic component 600 are formed in a semiconductor device that includes a plurality of circuit layers, for illustration, including circuit layers L1, L2 and L3 as illustrated in FIG. 6A. The configurable heater 130 and the photonic component 600 are formed on the same circuit layer L2, in which the configurable heater 130 is disposed neighboring to the photonic component 600.

Figure 6B:
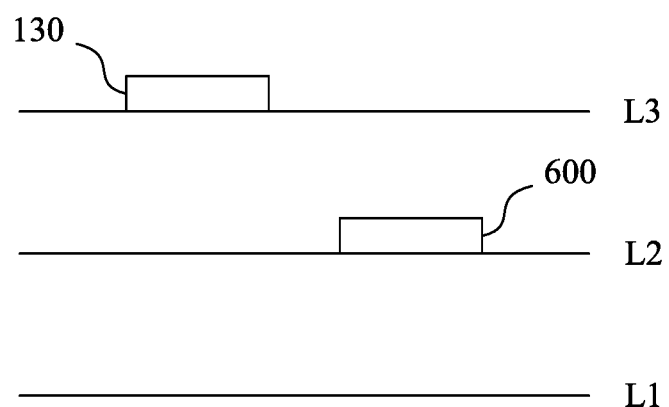

FIG. 6B is an exemplary cross-sectional diagram illustrating the position of the configurable heater 130 illustrated in FIG. 1, relative to the photonic component 600, in accordance with various embodiments of the present disclosure.

In some embodiments, the configurable heater 130 and the photonic component 600 are formed in different circuit layers of the semiconductor device. For illustration in FIG. 6B, the photonic component 600 is disposed on the circuit layer L2, and the configurable heater 130 is disposed on the circuit layer L3 above the circuit layer L2.

Figure 6C:
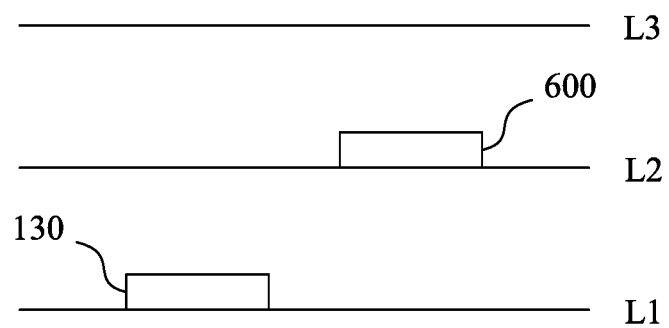

FIG. 6C is an exemplary cross-sectional diagram illustrating the position of the configurable heater 130 illustrated in FIG. 1, relative to the photonic component 600, in accordance with various embodiments of the present disclosure.

In some embodiments, the configurable heater 130 and the photonic component 600 are formed in different circuit layers of the semiconductor device. For illustration in FIG. 6C, the photonic component 600 is disposed on the circuit layer L2, and the configurable heater 130 is disposed on the circuit layer L1 under the circuit layer L2.

In some embodiments, the photonic component 600 in FIGS. 6A-6C is implemented by the photonic component 200 in FIG. 2A or the photonic component 220 in FIG. 2B. The positions of the configurable heater 130 illustrated in FIG. 1, relative to the photonic component 600, illustrated in FIGS. 6A-6C, are given for illustrative purposes. Various positions of the configurable heater 130 illustrated in FIG. 1, relative to the photonic component 600, are within the contemplated scope of the present disclosure.

Figure 7A:
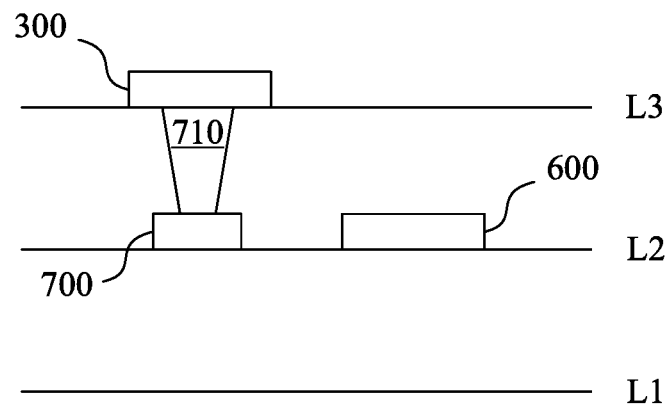
FIG. 7A and FIG. 7B are exemplary cross-sectional diagrams illustrating the position of the heater segment illustrated in FIG. 3A, relative to a photonic component, in accordance with various embodiments of the present disclosure.

FIG. 7A is an exemplary cross-sectional diagram illustrating the position of the heater segment 300 illustrated in FIG. 3A, relative to the photonic component 600, in accordance with various embodiments of the present disclosure.

As illustratively shown in FIG. 7A, the photonic component 600 is disposed on the circuit layer L2, and the heater segment 300 is disposed on the circuit layer L3 above the circuit layer L2. In some embodiments, the configurable heater 130 in FIG. 1 further includes an assist slice 700 and a slice supporter 710 to assist the heat transfer from the layer L3 to the layer L2. In some embodiments, the assist slice 700 is also referred to as a conductor or a heat-conductive segment configured to transfer heat. In some embodiments, the slice supporter 710 is also referred to as a pillar which couples the heater segment 300 to the assist slice 700, as illustrated in FIG. 7A. In some embodiments, both of the assist slice 700 and the slice supporter 710 are made of material, including, for example, metal, that is able to transfer heat.

For illustration in FIG. 7A, the assist slice 700 is disposed on the same circuit layer L2 that the photonic component 600 locates. The slice supporter 710 is coupled to the assist slice 700 on the circuit layer L2 and the heater segment 300 on the circuit layer L3. With such a configuration, the slice supporter 710 transfers the heat generated from the heater segment 300 to the assist slice 700. The assist slice 700 further provides heat to the environment that the photonic component 600 locates to increase the ambient temperature of the environment.

Figure 7B:
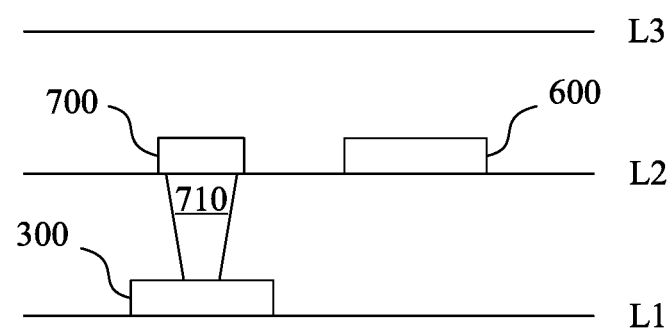

FIG. 7B is an exemplary cross-sectional diagram illustrating the position of the heater segment 300 illustrated in FIG. 3A, relative to the photonic component 600, in accordance with various embodiments of the present disclosure.

As illustratively shown in FIG. 7B, the photonic component 600 is disposed on the circuit layer L2, and the heater segment 300 is disposed on the circuit layer L1 below the circuit layer L2. In some embodiments, the configurable heater 130 in FIG. 1 further includes the assist slice 700 and the slice supporter 710 as discussed above, that are formed to assist the heat transfer from the circuit layer L1 to the circuit layer L2.

For illustration in FIG. 7B, the assist slice 700 is disposed on the same circuit layer L2 that the photonic component 600 locates. The slice supporter 710 is coupled to the assist slice 700 on the circuit layer L2 and the configurable heater 130 on the circuit layer L1. With such a configuration, the slice supporter 710 transfers the heat generated from the heater segment 300 to the assist slice 700. The assist slice 700 further provides heat to the environment that the photonic component 600 locates to increase the ambient temperature of the environment.

The positions of the heater segment 300 illustrated in FIG. 3A, relative to the photonic component 600, illustrated in FIGS. 7A-7B, are given for illustrative purposes. Various positions of the heater segment 300 illustrated in FIG. 3A, relative to the photonic component 600, are within the contemplated scope of the present disclosure.

Figure 8A:
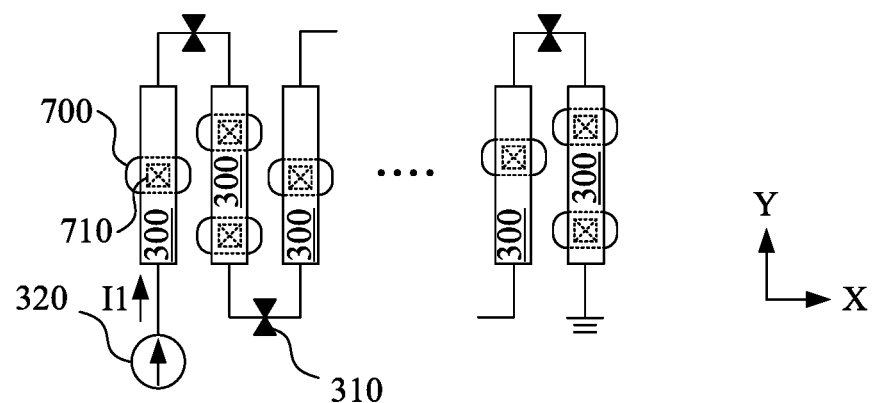
FIG. 8A is an exemplary diagram of the configurable heater illustrated in FIG. 1, in accordance with various embodiments of the present disclosure.

FIG. 8A is an exemplary diagram illustrating a configuration of the configurable heater 130 illustrated in FIG. 1, in accordance with various embodiments of the present disclosure.

As illustratively shown in FIG. 8A, the configurable heater 130 includes a plurality of heater segments 300, in which the heater segments 300 are strips disposed parallel to each other. Furthermore, the configurable heater 130 in FIG. 8A also includes the assist slices 700 and the slice supporters 710 formed either above or below the heater segments 300, as discussed above with reference to FIGS. 7A and 7B.

In some embodiments, each of the heater segments 300 extends along a Y direction, for illustration in FIG. 8A. Each of the assist slices 700 extend along an X direction that is substantially orthogonal to the Y direction, for illustration in FIG. 8A. The number of the assist slices 700 and the slice supporters 710 configured with each one of the heater segments 300 in FIG. 8A is given for illustrative purposes. Various numbers of the assist slices 700 and the slice supporters 710 configured with each one of the heater segments 300 are within the contemplated scope of the present disclosure. For example, in various embodiments, there are one assist slice 700 and one slice supporter 710 configured with one heater segment 300, and there are two assist slices 700 and two slice supporters 710 configured with one heater segment 300, as illustrated in FIG. 8A.

Figure 8B:
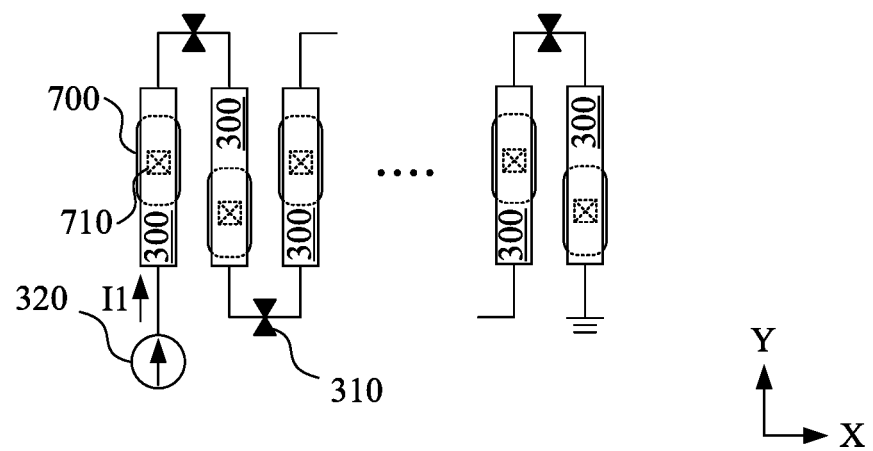
FIG. 8B is an exemplary diagram of the configurable heater illustrated in FIG. 1, in accordance with various embodiments of the present disclosure.

FIG. 8B is an exemplary diagram illustrating another configuration of the configurable heater 130 illustrated in FIG. 1, in accordance with various embodiments of the present disclosure.

As illustratively shown in FIG. 8B, the configurable heater 130 includes a plurality of heater segments 300, in which the heater segments 300 are strips disposed parallel to each other. Furthermore, the configurable heater 130 in FIG. 8B also includes the assist slices 700 and the slice supporters 710 formed either above or below the heater segments 300, as discussed above with reference to FIGS. 7A and 7B.

In some embodiments, each of the heater segments 300 extends along the Y direction, for illustration in FIG. 8B. Each of the assist slices 700 also extends along the Y direction, for illustration in FIG. 8B. The number of the assist slices 700 and the slice supporters 710 configured with each one of the heater segments 300 in FIG. 8B is given for illustrative purposes. Various numbers of the assist slices 700 and the slice supporters 710 configured with each one of the heater segments 300 are within the contemplated scope of the present disclosure.

The configurations of the configurable heater 130 illustrated in FIGS. 8A-8B are given for illustrative purposes. Various configurations of the configurable heater 130 are within the contemplated scope of the present disclosure.

Figure 9:
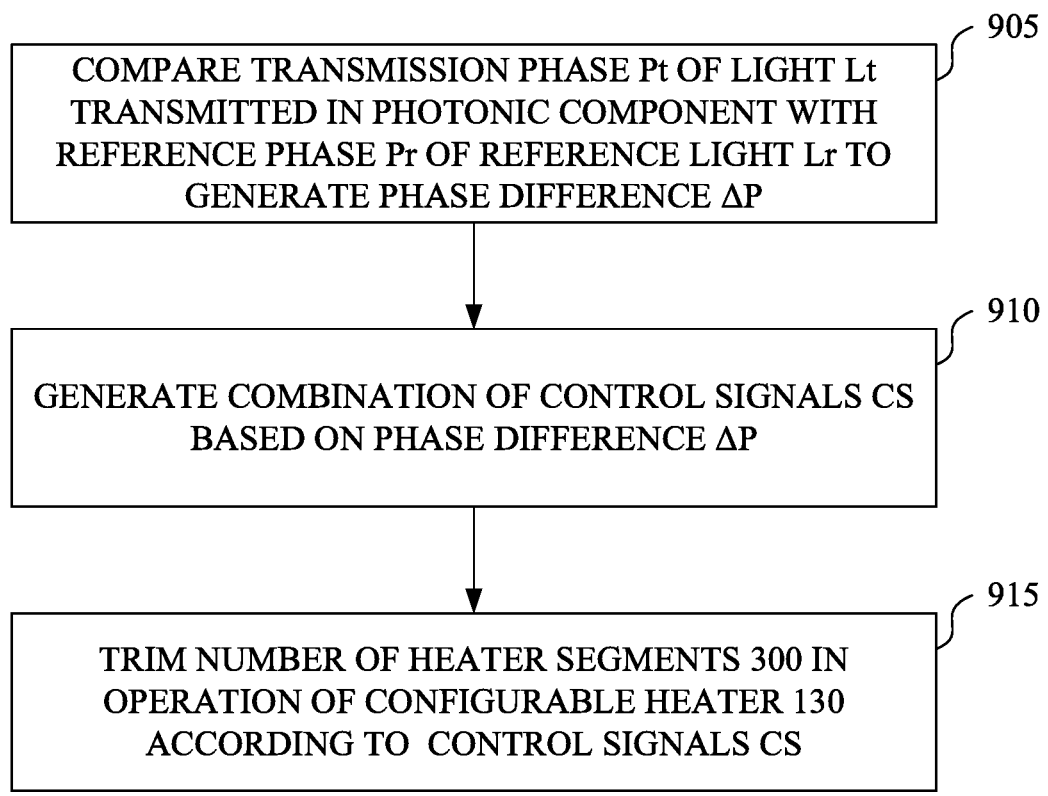
FIG. 9 is a flow chart of a configuring method illustrating a configuring process of the configurable heating device illustrated in FIG. 1, in accordance with various embodiments of the present disclosure.

FIG. 9 is a flow chart of a configuring method 900 illustrating a configuring process of the configurable heating device 100 illustrated in FIG. 1, in accordance with various embodiments of the present disclosure.

With reference to the method 900 illustrated in FIG. 9 and the configurable heating device 100 illustrated in FIG. 1, in operation 905, the comparator 110 is configured to compare the transmission phase Pt of the light Lt transmitted in the photonic component with the reference phase Pr of the reference light Lr to generate the phase difference ΔP.

In operation 910, the controller 120 is configured to generate a combination of control signals CS based on the phase difference ΔP. As discussed above with reference to FIG. 3A, in some embodiments, the control signals CS includes control signals CS1, CS2, . . . , and CSN, and the control signals CS1, CS2, . . . , and CSN are configured to control the corresponding switches 310 to further adjust the number of the heat segments 300 in operation.

In operation 915, the number of the heater segments 300 in operation of the configurable heater 130 is trimmed according to the control signals CS.

The number and the order of the operations illustrated in FIG. 9 are given for illustrative purposes. Various numbers and the orders of the operations are within the contemplated scope of the present disclosure.

An aspect of this disclosure relates to a device. The device includes a comparator configured to compare a transmission phase of light in a photonic component with a reference phase. The device further includes a heater configured to control a temperature of the photonic component. The heater includes a plurality of heater segments, and a plurality of switches, wherein each switch of the plurality of switches is between a pair of heater segments of the plurality of heater segments. The device further includes a controller configured to control operation of each switch of the plurality of switches based on results from the comparator for selectively connecting heater segments of the plurality of heater segments in series. In some embodiments, each heater segment of the plurality of heater segments extends in a first direction. In some embodiments, heater segments of the plurality of heater segments are arranged in a concentric pattern. In some embodiments, a first heater segment of the plurality of heater segments extends in a first direction, and a second heater segment of the plurality of heater segments extends in a second direction perpendicular to the first direction. In some embodiments, a first heater segment of the plurality of heater segments includes a first portion on a first circuit layer, and a second portion on a second circuit layer, wherein the second circuit layer is different from the first circuit layer. In some embodiments, the first heater segment further includes a pillar electrically connecting the first portion to the second portion.

An aspect of this disclosure relates to a method. The method includes comparing a transmission phase of light in a photonic component with a reference phase. The method further includes generating a control signal based on the comparing. The method further includes selectively connecting heater segments of a heater using the control signal, wherein the selectively connecting heater segments comprises controlling at least one switch for selectively connecting the heater segments in series. In some embodiments, the selecting connecting heater segments includes determining a number of heater segments to connect based on a magnitude of a difference between the transmission phase and the reference phase. In some embodiments, the method further includes selectively connecting heater segments of the heater to ground using the control signal. In some embodiments, the generating the control signal includes generating a plurality of control signals, and each control signal of the plurality of control signals controls a corresponding heater segment of the heater.

An aspect of this description relates to a device. The device includes a photonic component. The device further includes a heating device configured to control a temperature of the photonic component. The heating device includes a comparator configured to compare a transmission phase of light in the photonic component with a reference phase to generate a phase difference signal. The heating device further includes a plurality of heater segments. The heating device further includes a plurality of switches, wherein each switch of the plurality of switches is between a pair of heater segments of the plurality of heater segments. The heating device further includes a controller configured to control operation of each switch of the plurality of switches based on the phase difference signal for selectively connecting heater segments of the plurality of heater segments. In some embodiments, the photonic component includes a first transmission line; a second transmission line spaced from the first transmission line; and a ring transmission line between the first transmission line and the second transmission line. In some embodiments, the ring transmission line surrounds the plurality of heater segments. In some embodiments, the photonic component includes a first transmission line, wherein the first transmission line includes a first segment and a second segment; and a second transmission line, wherein the second transmission line includes a third segment and a fourth segment, a first distance between the first segment and the third segment in a first direction is different from a second distance between the third segment and the fourth segment in the first direction. In some embodiments, the second distance is less than the first distance. In some embodiments, the second segment and the fourth segment are between a first heater segment of the plurality of heater segments and a second heater segment of the plurality of heater segments. In some embodiments, a first switch of the plurality of switches includes a first transistor configured to receive the phase difference signal; and a second transistor configured to receive an inverted signal of the phase difference signal. In some embodiments, the first transistor is configured to selectively connect a first heater segment of the plurality of heater segments to a second heater segment of the plurality of heater segments. In some embodiments, the second transistor is configured to selectively connect the first heater segment to ground. In some embodiments, a first heater segment of the plurality of heater segments includes a first portion on a first circuit layer; a second portion on a second circuit layer, wherein the second circuit layer is different from the first circuit layer; and a pillar electrically connecting the first portion to the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
 a comparator configured to compare a transmission phase of light in a photonic component with a reference phase;
 a heater configured to control a temperature of the photonic component, wherein the heater comprises:
  a plurality of heater segments, and
  a plurality of switches, wherein each switch of the plurality of switches is between a pair of heater segments of the plurality of heater segments; and
 a controller configured to control operation of each switch of the plurality of switches based on results from the comparator for selectively connecting heater segments of the plurality of heater segments in series.

2. The device of claim 1, wherein each heater segment of the plurality of heater segments extends in a first direction.

3. The device of claim 1, where heater segments of the plurality of heater segments are arranged in a concentric pattern.

4. The device of claim 1, wherein a first heater segment of the plurality of heater segments extends in a first direction, and a second heater segment of the plurality of heater segments extends in a second direction perpendicular to the first direction.

5. The device of claim 1, wherein a first heater segment of the plurality of heater segments comprises:
   a first portion on a first circuit layer; and
   a second portion on a second circuit layer, wherein the second circuit layer is different from the first circuit layer.

6. The device of claim 5, wherein the first heater segment further comprises a pillar electrically connecting the first portion to the second portion.

7. A method comprising:
   comparing a transmission phase of light in a photonic component with a reference phase;
   generating a control signal based on the comparing; and
   selectively connecting heater segments of a heater using the control signal, wherein the selectively connecting heater segments comprises controlling at least one switch for selectively connecting the heater segments in series.

8. The method of claim 7, wherein the selectively connecting heater segments comprises determining a number of heater segments to connect based on a magnitude of a difference between the transmission phase and the reference phase.

9. The method of claim 7, further comprising selectively connecting heater segments of the heater to ground using the control signal.

10. The method of claim 7, wherein the generating the control signal comprises generating a plurality of control signals, and each control signal of the plurality of control signals controls a corresponding heater segment of the heater.

11. A device comprising:
    a photonic component; and
    a heating device configured to control a temperature of the photonic component, wherein the heating device comprises:
       a comparator configured to compare a transmission phase of light in the photonic component with a reference phase to generate a phase difference signal;
       a plurality of heater segments, and
       a plurality of switches, wherein each switch of the plurality of switches is between a pair of heater segments of the plurality of heater segments; and
       a controller configured to control operation of each switch of the plurality of switches based on the phase difference signal for selectively connecting heater segments of the plurality of heater segments.

12. The device of claim 11, wherein the photonic component comprises:
    a first transmission line;
    a second transmission line spaced from the first transmission line; and
    a ring transmission line between the first transmission line and the second transmission line.

13. The device of claim 12, wherein the ring transmission line surrounds the plurality of heater segments.

14. The device of claim 11, wherein the photonic component comprises:
    a first transmission line, wherein the first transmission line comprises a first segment and a second segment; and
    a second transmission line, wherein the second transmission line comprises a third segment and a fourth segment, a first distance between the first segment and the third segment in a first direction is different from a second distance between the third segment and the fourth segment in the first direction.

15. The device of claim 14, wherein the second distance is less than the first distance.

16. The device of claim 15, wherein the second segment and the fourth segment are between a first heater segment of the plurality of heater segments and a second heater segment of the plurality of heater segments.

17. The device of claim 11, wherein a first switch of the plurality of switches comprises:
    a first transistor configured to receive the phase difference signal; and
    a second transistor configured to receive an inverted signal of the phase difference signal.

18. The device of claim 17, wherein the first transistor is configured to selectively connect a first heater segment of the plurality of heater segments to a second heater segment of the plurality of heater segments.

19. The device of claim 18, wherein the second transistor is configured to selectively connect the first heater segment to ground.

20. The device of claim 11, wherein a first heater segment of the plurality of heater segments comprises:
    a first portion on a first circuit layer;
    a second portion on a second circuit layer, wherein the second circuit layer is different from the first circuit layer; and
    a pillar electrically connecting the first portion to the second portion.

* * * * *